United States Patent

Dydyk et al.

[11] 4,162,458
[45] Jul. 24, 1979

[54] TM COAXIAL CAVITY OSCILLATOR AND POWER COMBINER

[75] Inventors: Michael Dydyk, Scottsdale; Joseph R. Tuzzolino, Phoenix, both of Ariz.

[73] Assignee: Motorola, Inc., Schaumburg, Ill.

[21] Appl. No.: 910,162

[22] Filed: May 26, 1978

[51] Int. Cl.² .............................................. H03B 7/14
[52] U.S. Cl. ................................... 331/56; 331/101; 331/107 P; 331/107 G
[58] Field of Search ............. 331/56, 101, 102, 107 R, 331/107 G, 107 T, 107 P, 107 C

[56] References Cited

U.S. PATENT DOCUMENTS

| | | | |
|---|---|---|---|
| 3,393,378 | 7/1968 | Bene et al. | 331/101 |
| 3,626,327 | 12/1971 | Luchsinger et al. | 331/107 R |
| 4,031,486 | 6/1977 | Havens | 331/96 |
| 4,034,314 | 7/1977 | Dydyk | 331/56 |
| 4,075,578 | 2/1978 | Dydyk | 331/56 |
| 4,083,016 | 4/1978 | Zangrando et al. | 331/107 R |
| 4,090,152 | 5/1978 | Dydyk | 331/56 |

*Primary Examiner*—Siegfried H. Grimm
*Attorney, Agent, or Firm*—Eugene A. Parsons

[57] ABSTRACT

In an oscillator or power combiner of the type operating at microwave, millimeter wave and above, apparatus for increasing the size, so that one or more active devices can be coupled to the oscillator, including a TM coaxial cavity operating at a predetermined frequency, which cavity has an output coupled thereto for removing power, and a second cavity operating at a dominant mode and coupled to the TM coaxial cavity, which second cavity assures efficient and spurious free operation of the oscillator or power combiner at the desired frequency.

10 Claims, 3 Drawing Figures

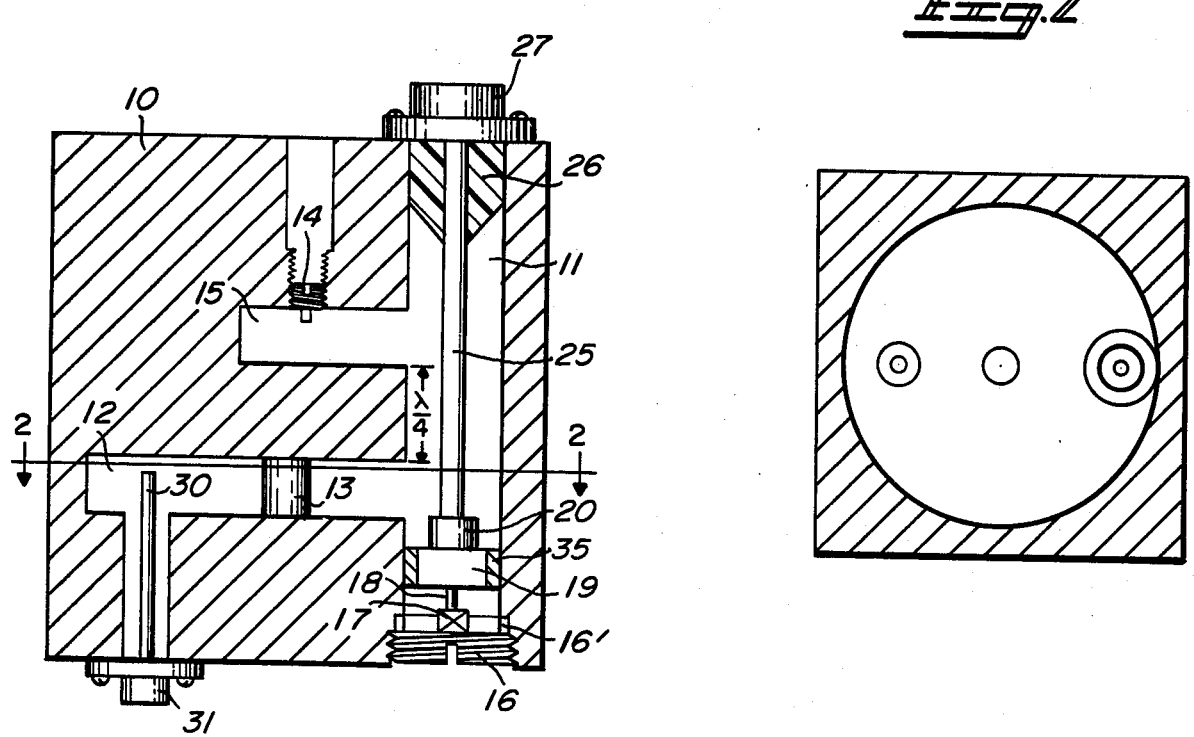
Fig.2
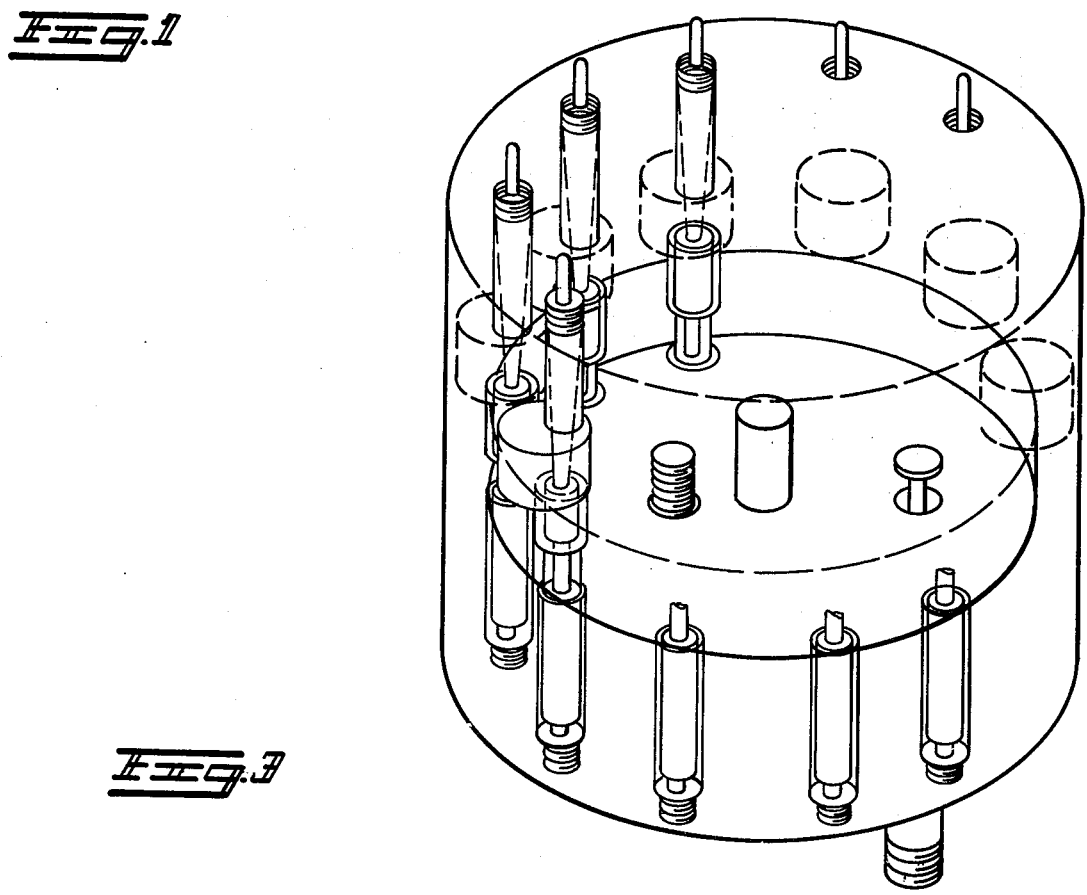
Fig.1
Fig.3

TM COAXIAL CAVITY OSCILLATOR AND POWER COMBINER

BACKGROUND OF THE INVENTION

Oscillators constructed to operate in frequencies of microwave, millimeter wave and above are extremely small and it is extremely difficult to couple one or more active devices thereto. In fact, oscillators in the millimeter wave frequency range are so small it is difficult to couple a single active device, such as an IMPATT diode, thereto. Even for an oscillator operating in the microwave range it is difficult to couple a plurality of active devices to the oscillator to obtain higher output power levels. A typical prior art microwave oscillator including apparatus for utilizing a plurality of active devices to improve the power output, is illustrated and described in U.S. Pat. No. 4,034,314, entitled "Microwave Diode Coaxial Circuit Oscillator Improvement", issued July 5, 1977 and assigned to the same assignee. Because of the small size of the resonant cavities in the prior art devices, the number of active devices which may be utilized to increase the power output is severely limited.

Also in the prior art, an attempt was made to increase the size of the resonant cavity by operating the cavity in a higher order mode. In doing this, other undesirable resonances appear below and above the operating frequency. These resonances will generate spurious responses. To suppress these resonances this prior art structure utilizes absorptive filters to reduce the Q of the undesirable resonances. Unfortunately, this approach also reduces the Q of the desired resonance, resulting in an inefficient oscillator.

A related invention is disclosed in a co-pending application entitled "Microwave/Millimeter Wave Oscillator", filed Mar. 16, 1978, Ser. No. 887,142, and assigned to the same assignee. The apparatus described in this co-pending application is designed to solve the same problems as the present invention.

SUMMARY OF THE INVENTION

The present invention pertains to oscillatory and power combining apparatus for frequencies on the order to microwave, millimeter wave and above including a TM coaxial cavity tuned to operate at a predetermined frequency, in the fundamental or a higher order mode, a second resonant circuit tuned to operate in the dominant mode at the predetermined frequency and one or more active devices coupled to the resonant cavities for controlling oscillations therein to the predetermined frequency. Because a TM coaxial cavity is used, it is larger than it would be if it were a simple cylindrical cavity operating at the dominate mode and, hence, there is greater space for coupling additional active devices thereto. If the TM coaxial cavity is operated in a higher order mode resonance, complications of having to deal with other undesirable resonances are present. Suppression or preventing proper oscillatory conditions at these undesirable resonances is essentially due to the active devices better than octave bandwidth, negative resistance characteristics.

It is an object of the present invention to provide oscillatory apparatus for frequencies on the order of microwave, millimeter wave and above with a greater size so that one or more active devices can be more easily coupled thereto and operation at the desired frequency will be guaranteed without loss in efficiency.

It is a further object of the present invention to provide oscillatory and power combining apparatus for frequencies on the order of microwave, millimeter wave and above which include a TM coaxial cavity as the main oscillatory cavity to increase the size thereof.

These and other objects of this invention will become apparent to those skilled in the art upon consideration of the accompanying specification, claims and drawings.

BRIEF DESCRIPTION OF THE DRAWINGS

Referring to the drawings,

FIG. 1 is a cross-sectional view of an oscillator embodying the present invention;

FIG. 2 is a sectional view as seen from the line 2—2 in FIG. 1; and

FIG. 3 is a view in perspective of a power combining device embodying the present invention, portions thereof shown in phantom.

DESCRIPTION OF THE PREFERRED EMBODIMENT

Referring specifically to FIGS. 1 and 2, the numeral 10 indicates a housing having an elongated cylindrically shaped opening 11 formed therethrough. A first generally cylindrically shaped cavity 12 is formed in the housing 10 with an axially positioned post 13 extending therethrough to form a TM coaxial cavity in communication with the opening 11. A second generally cylindrically shaped cavity 15 is formed in the housing 10 in communication with the opening 11. The axes of the opening 11 and the cavities 12 and 15 are parallel but spaced apart so that the opening 11 extends through the cavities 12 and 15 and, in this embodiment, is generally tangent to the outer wall of each of said cavities (see FIG. 2). The housing 10 and the various parts described herein may be constructed of electrically conducting material or simply coated to provide the required conduction, as is well known to those skilled in the art.

A plug 16 is threadedly engaged in one end of the opening 11 to seal the one end. The plug 16 may provide an adjustable feature (such as a tubular shaped spacer 16') to adjust the length of the opening 11 and the spacing between the end thereof and the cavity 12, if desired. An active device 17, which may be for example a negative resistance diode such as an IMPATT diode or the like, is mounted with one end physically and electrically connected to the plug 16. The opposite end of the device 17 is connected through a three step (in this embodiment) equalizing network, designated 18, 19 and 20, and a coaxially positioned rod 25 to a matching load termination 26. The rod 25 actually extends through the load termination 26 to the center contact of a bias input terminal 27 external to the housing 10. The input terminal 27 is designed to have a bias source (not shown) attached thereto for biasing the active device 17 into the desired operating region. The opening 11 and rod 25 operate as a section of coaxial line with the equalizing network operating to couple the active device 17 to the coaxial line with the correct impedance. The section 20 of the equalizing network is connected to the rod 25 approximately in the plane of the lower wall (in FIG. 1) of the cavity 12. A probe 30 extends from the center conductor of an output terminal 31 through an opening in the housing 10 into the cavity 12. The probe 30 is positioned approximately midway between the outer periphery of the wall of the cavity 12 and the center post 13, since this will be approximately a maximum field of the fundamental resonance of the TM coaxial cavity. It should be understood, of course, that the probe 30 may be positioned at different points within the cavity 12 and the specific mode of operation of the TM coaxial cavity may alter the preferred position. The probe 30 is provided to remove power from the cavity 12 at the desired frequency. The output power can also be extracted with the same coupling mechanism as used in the coaxial/active device module, described in U.S. Pat. Nos. 4,075,578, issued Feb. 21, 1978 and assigned to the same assignee.

While the opening 11, forming the outer conductor of the section of coaxial line is illustrated as generally tangient to the outer walls of the cavities 12 and 15, it should be understood that this relationship will vary with the amount of coupling required. The amount of coupling between the cavity 15 and the section of coaxial line is a function of the distance between the axis of the cavity 15 and the center conductor, rod 25, of the section of coaxial line. The amount of coupling between the TM coaxial cavity (cavity 12) and the section of coaxial line is a function of the distance between the center conductor, rod 25, of the section of coaxial line and a line midway between the outer periphery of the cavity 12 and the center post 13.

The TM coaxial cavity (cavity 12) is designed to operate at a specific, or predetermined, frequency in the fundamental or a higher order mode (i.e., $TM_{ONO}$, where N is a digit 1 or greater). The design of the TM coaxial cavity does not follow standard cylindrical resonant cavity equations, but must be calculated as shown below.

The resonant frequency for a co-axial cavity operating in the $TM_{mnq}$ mode is given by:

$$f_{RESONANCE} = \frac{v_0}{2\pi} \sqrt{\left(\frac{q\pi}{d}\right)^2 + \left(\frac{r_{mn}}{a\left(\frac{b}{a}-1\right)}\right)^2}$$

$$r_{mn} = \left(\frac{b}{a} - 1\right) X_{mn}; \begin{cases} b/a > 1 \\ m = 0, 1, 2, .... \\ n = 1, 2 .... \\ q = 0, 1, 2, .... \end{cases}$$

where
$v_0$ = speed of light in vacuum
d = cavity height
b = coaxial cavity outer diameter
a = coaxial cavity inner diameter
$X_{mn}$ = roots of the Bessel-Neumann characteristic equation We can confine the cavity resonances to the $TM_{mno}$ modes by choosing $d << \lambda_g/2$ at the desired operating frequency (where $\lambda_g$ equals the wavelength of the coaxial cavity resonant frequency) which is then determined from $$f_{RESONANCE} = \frac{v_0}{2\pi} \frac{r_{mn}}{a\left(\frac{b}{a}-1\right)}$$

As can be seen from a comparison of the above equations and the standard cylindrical resonant cavity equations, the TM coaxial resonant cavity is larger than a cylindrical resonant cavity and, therefore, provides additional area for coupling one or more active devices thereto. If still more additional area is required so that a greater number of active device can be coupled thereto, the TM coaxial resonant cavity can be operated in a higher order mode, generally as set forth in the above described co-pending application.

The second cavity 15 is a resonant circuit with a dominant mode and may have higher order modes, but they will be high enough in frequency to have no effect on the oscillator. The cavity 15 may be constructed with any of a variety of cavity configurations (cylindrical, rectangular, etc.) all of which are encompassed herein and a circular cross-section, cylindrical cavity is illustrated only for convenience and simplicity of construction. A tuning element 14 is provided for tuning the cavity 15 to the desired resonance. The dominate mode of the resonant cavity 15 is the frequency of oscillation of the apparatus and is the same frequency as the frequency of the mode at which the cavity 12 is designed to operate. The plane containing the upper surface of the cavity 12 and the plane containing the lower surface of the cavity 15 are parallel and spaced apart a distance equal to one-quarter wavelength of the operating frequency of the oscillator. Because the cavity 15 is resonant at the operating frequency it is very high impedance and the quarter wavelength section of coaxial line present a virtual short circuit to the operating frequency at the upper surface of the cavity 12.

The equalizing network is constructed so that the circuit, looking into the active device 17 from the lower wall of the cavity 12, looks like a pure negative resistance and the circuit, looking into the cavity 12 from the equalizing network, looks like a purely real resistance. Also, the equalizing network is designed so that the impedance seen by the active device 17 is directly proportional to the loading of the cavities 12 and 15. Because the active device 17 will lock onto the frequency at which there is the most gain, under the above described circumstances the active device 17 will lock onto the frequency controlled by the second cavity 15, since the cavity 15 is not loaded and provides minimum real impedance when combined with the quarter wave section of transmission line. In the present embodiment, the above described requirements are met by constructing the equalizing network with three sections, 18, 19 and 20, but it should be understood that these requirements could be met with many other embodiments known to those skilled in the art. Section 18 is constructed to resonate out the reactance of the active device 17 (the length of section 18 is a function of the reactance of the device 17) and each of the sections 19 and 20 are constructed one quarter wavelength at the operating frequency to operate as transformers. A tubular section 35 of dielectric material is placed between the transformer section 19 and the wall of the housing 10 to support the equalizing network in the opening 11. It should be understood that the equalizing network, as described, is useful in maintaining the oscillator at the desired frequency when the TM coaxial resonant cavity (cavity 12) is operating in a higher order mode. However, if the TM coaxial cavity (cavity 12) is operating in the fundamental mode the equalizing network described above may not be necessary and an equalizing network simply matching the device 17 to the section of coaxial line (opening 11 and center conductor 25) may be sufficient.

Thus, the cavity 15, which operates in its dominant mode, controls the frequency of the oscillator and the TM coaxial resonant cavity is operated in a fundamental or higher order mode so that it is large enough to realize a single or N active device oscillator without introducing spurious oscillations or reducing efficiency. If additional active devices are desired to increase the power output, FIG. 3 illustrates an embodiment for accomplishing this feature. Basically, the structure illustrated in FIG. 3 is similar to the structure illustrated in FIGS. 1 and 2 except that additional active devices along with a coaxial section and secod or dominant mode cavity for each active device is added. While the embodiment of FIG. 3 illustrates a second or dominant mode cavity with each additional active device, in some instances the second cavity may be large enough to couple two or more active devices to each second cavity. It should also be understood that additional active devices and associated circuitry can be added if desired and the number of active device which can be added is dependent on the size of the TM coaxial resonant cavity. It will be recognized by those skilled in the art that many additional active devices and, therefore, a substantial amount of output power can be added by utilizing a TM coaxial resonant cavity operating at the fundamental or a higher order mode.

While we have shown and described specific embodiments of this invention, further modifications and improvements will occur to those skilled in the art. We desire it to be understood, therefore, that this invention is not limited to the particular forms shown and we intend in the appended claims to cover all modifications which do not depart from the spirit and scope of this invention.

What is claimed is:

1. In oscillatory apparatus for frequencies on the order of microwave, millimeter wave and above, including primary oscillatory circuitry having an active device coupled into said circuitry for sustaining oscillations therein and a first resonant circuit tuned to have an operating mode at a predetermined frequency, a second resonant circuit tuned to operate at the predetermined frequency and coupled to said primary oscillatory circuitry for controlling oscillations therein to the predetermined frequency, and output means coupled to said first resonant circuit for removing power therefrom at the predetermined frequency, the improvement comprising a TM coaxial cavity forming the first resonant circuit.

2. Oscillatory apparatus as claimed in claim 1 wherein a plurality of active devices are included in the primary oscillatory circuitry.

3. Oscillatory apparatus for frequencies on the order of microwave, millimeter and above, comprising:
   (a) an active device having a negative resistance region of operation;
   (b) a TM coaxial resonant cavity designed to operate at a predetermined frequency within the region of operation of said active device;
   (c) a second resonant cavity formed to have a dominant mode of operation at the predetermined frequency;
   (d) coupling apparatus for coupling said active device and said TM coaxial and second resonant cavities, said coupling apparatus including means for supplying operating power to said active device and said coupling apparatus being constructed for controlling oscillations in the oscillatory apparatus to the predetermined frequency; and
   (e) output means coupled to said TM coaxial cavity for removing power therefrom at the predetermined frequency.

4. Oscillatory apparatus as claimed in claim 3 wherein a plurality of active devices are coupled into the apparatus.

5. Oscillatory apparatus as claimed in claim 3 wherein the active device is coupled to the TM coaxial and second resonant cavities by means including an equalizing network constructed so that the impedances of the TM coaxial and second cavities at the active device are directly proportional to the loading of the TM coaxial and second cavities, respectively.

6. Oscillatory apparatus as claimed in claim 5 wherein the coupling apparatus includes a section of coaxial line.

7. Oscillatory apparatus as claimed in claim 6 wherein the active device is mounted adjacent one end of the section of coaxial line, the TM coaxial cavity is coupled to said section of coaxial line at a distance determined by the equalizing network, and the second cavity is coupled to said section of coaxial line at a distance from said TM coaxial cavity equal to N one-quarter wavelengths of the predetermined frequency, where N is an odd integer.

8. Oscillatory apparatus as claimed in claim 7 wherein a plurality of active devices are coupled to the TM coaxial cavity by a plurality of sections of coaxial line and to a plurality of second cavities by said plurality of sections of coaxial lines.

9. Oscillatory apparatus for frequencies on the order of microwave, millimeter wave and above, comprising primary oscillatory circuitry including an active device coupled into said circuitry for sustaining oscillations therein and a TM coaxial cavity tuned to have a higher mode of operation at a predetermined frequency, a second resonant cavity tuned to operate at the predetermined frequency and coupled to said primary oscillatory circuitry for controlling oscillations therein to the predetermined frequency, and output means coupled to said TM coaxial cavity for removing power therefrom at the predetermined frequency.

10. Oscillatory apparatus as claimed in claim 9 wherein the active device is coupled to the TM coaxial cavity and the second resonant cavity by means including an equalizing network constructed so that the impedances of the TM coaxial and second cavities at the active device are directly proportional to the loading of the TM coaxial and second cavities, respectively.

* * * * *